US012683607B2

(12) United States Patent
Pardeshi et al.

(10) Patent No.: US 12,683,607 B2
(45) Date of Patent: Jul. 14, 2026

(54) ELECTRONIC CONTROL UNIT INTERFACES WITH CONTROLLER-CONFIGURABLE INPUT SIGNAL CONDITIONING CIRCUITRY

(71) Applicant: Cummins Inc., Columbus, IN (US)

(72) Inventors: Viren Vilassinha Pardeshi, Aurangabad (IN); Subramanya Bhat, Udupi (IN); Vageesha Gowdra Parameswarappa, Nandal (IN); Hong Zhang, Columbus, IN (US)

(73) Assignee: Cummins Inc., Columbus, IN (US)

( * ) Notice: Subject to any disclaimer, the term of this patent is extended or adjusted under 35 U.S.C. 154(b) by 241 days.

(21) Appl. No.: 18/745,213

(22) Filed: Jun. 17, 2024

(65) Prior Publication Data

US 2025/0385673 A1    Dec. 18, 2025

(51) Int. Cl.
| | |
|---|---|
| *G06F 19/00* | (2018.01) |
| *B60W 10/06* | (2006.01) |
| *H03K 19/003* | (2006.01) |
| *H03K 19/0175* | (2006.01) |
| *H03K 19/173* | (2006.01) |

(52) U.S. Cl.
CPC ........... *H03K 19/003* (2013.01); *B60W 10/06* (2013.01); *H03K 19/017509* (2013.01); *H03K 19/1737* (2013.01)

(58) Field of Classification Search
CPC .... G01P 3/488; H04L 25/4902; F02D 41/266; G06F 13/4221; G06F 13/4072; H03K 19/017509; H03K 19/1737; H03K 19/018521; H03M 1/12
USPC ........................................................ 701/110
See application file for complete search history.

(56) References Cited

U.S. PATENT DOCUMENTS

| | | |
|---|---|---|
| 5,544,000 A | 8/1996 | Suzuki et al. |
| 6,897,688 B2 | 5/2005 | Lee |
| 6,981,090 B1 | 12/2005 | Kutz et al. |

(Continued)

FOREIGN PATENT DOCUMENTS

DE        102015211706        12/2016

OTHER PUBLICATIONS

Curtis System Controller Model 1351. Can I/O Module, available at www.curtisinstruments.com, Feb. 1, 2024, 6 pgs.

(Continued)

*Primary Examiner* — Hung Q Nguyen
*Assistant Examiner* — James J Kim
(74) *Attorney, Agent, or Firm* — Taft, Stettinius & Hollister LLP

(57) ABSTRACT

A controller-configurable input signal conditioning (C-CISC) circuit includes an input node, a first switch, a second switch, and a multiplexer which are operatively coupled with an output pin of a microcontroller. First and second signal conditioning branches of the C-CISC circuit are operatively coupled with an input node and a sensor signal input pin of the microcontroller controller via a first input and a second input of a multiplexer. The C-CISC circuit is configurable in response to a first output of the sensor selection output pin to provide an analog signal input received at the input node to the sensor signal input pin and configurable in response to a second output of the sensor selection output pin to provide a single edge nibble transmission (SENT) signal input received at the input node to the sensor signal input pin.

20 Claims, 8 Drawing Sheets

(56)                    References Cited

U.S. PATENT DOCUMENTS

| | | | | |
|---|---|---|---|---|
| 12,104,900 | B2 * | 10/2024 | Casu ..................... | G01P 3/489 |
| 2005/0204224 | A1 | 9/2005 | Piasecki et al. | |
| 2005/0261821 | A1 | 11/2005 | Abe et al. | |
| 2007/0067090 | A1 | 3/2007 | Hashimoto et al. | |
| 2008/0074209 | A1 | 3/2008 | Ceylan et al. | |
| 2012/0137030 | A1 | 5/2012 | Gillingham | |
| 2012/0206889 | A1 | 8/2012 | Norman | |
| 2015/0378954 | A1 | 12/2015 | Field et al. | |
| 2019/0199451 | A1 | 6/2019 | Krall et al. | |
| 2020/0145017 | A1 | 5/2020 | Pardoen et al. | |
| 2022/0107345 | A1 * | 4/2022 | Nakagawa ....... | H03K 19/00315 |
| 2023/0175454 | A1 | 6/2023 | Hershorin et al. | |
| 2023/0236071 | A1 * | 7/2023 | Nakajima ............ | H03M 1/007 |
| | | | | 374/170 |

OTHER PUBLICATIONS

FlexInput IC for automotive applications, L9966 Data Sheet; available at https://www.st.com/resource/en/data_brief/I9966.pdf, Jan. 1, 2022, 122 pgs.

Kramolis, Josef , et al., "Sent/SPC Driver for the MPC55109 Microcentroller Family", Kramolis, Josef et al., "Sent/SPC Driver for the MPC5510 Microcontroller Family", Freescale Semiconductor Application Notes, Oct. 2010, 27 pgs.

Olea, Luis , "Using the SENT Transmitter Module in S12ZVC Devices", Olea, Luis, "Using the SENT Transmitter Module in S12ZVC Devices", Freescale Semiconductor, Dec. 2013, 9 pgs.

German Office Action, German Appln. No. 10 2024 131 087.1, (With English Translation) 14 pgs., dated Jun. 26, 2025.

* cited by examiner

ELECTRONIC CONTROL UNIT INTERFACES WITH CONTROLLER-CONFIGURABLE INPUT SIGNAL CONDITIONING CIRCUITRY

TECHNICAL FIELD

The present application relates to electronic control unit (ECU) interfaces and more particularly but not exclusively to ECU interfaces with controller-configurable input signal conditioning ("C-CISC") circuitry and related apparatuses, systems, and processes.

BACKGROUND

An electronic control unit (ECU) may be provided in applications such as vehicle systems, engine systems, power generation systems, and other industrial equipment or systems. An ECU may be required to interface with multiple types of sensors which may provide a plurality of types and/or forms of sensor outputs for processing by the ECU. ECU designs face of number of constraints and limitations including those respecting configurability, adaptability, and flexibility to support multiple applications and features, and limitations on input/output (I/O) pins, mechanical package size, PCB density, and other constraints and limitations. There remains a significant need for the unique apparatuses, processes, and systems disclosed herein.

DISCLOSURE OF EXAMPLE EMBODIMENTS

For the purposes of clearly, concisely, and exactly describing example embodiments of the present disclosure, the manner, and process of making and using the same, and to enable the practice, making and use of the same, reference will now be made to certain example embodiments, including those illustrated in the figures, and specific language will be used to describe the same. It shall nevertheless be understood that no limitation of the scope of the invention is thereby created, and that the invention includes and protects such alterations, modifications, and further applications of the example embodiments as would occur to one skilled in the art.

SUMMARY OF THE DISCLOSURE

Some embodiments include apparatuses including unique controller-configurable input signal conditioning ("C-CISC") circuitry. Some embodiments include unique processes involving unique C-CISC circuitry. Some embodiments include unique systems including C-CISC circuitry. Further embodiments, forms, objects, features, advantages, aspects, and benefits shall become apparent from the following description and drawings.

DETAILED DESCRIPTION OF EXAMPLE EMBODIMENTS

Figure 1:
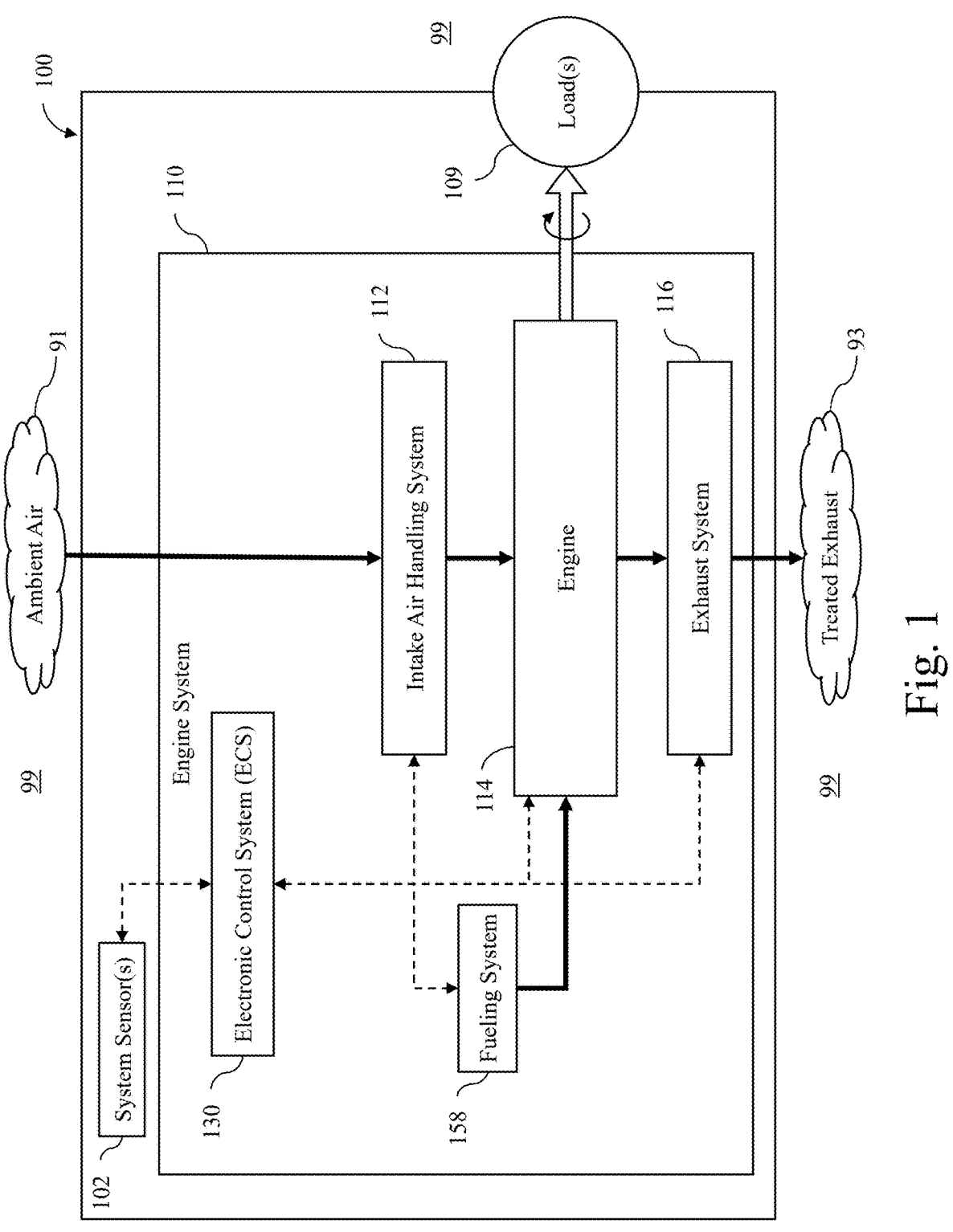
FIG. 1 is a schematic diagram depicting certain aspects of an example system in an example operating environment.

With reference to FIG. 1, there is illustrated an example system 100 including a prime mover system 110 (also referred to herein as system 110) and at least a portion of one or more loads 109. System 100 may be provide in a number of forms including, for example, in the form of a vehicle or vehicle powertrain system (e.g., an on-highway vehicle or vehicle powertrain system or an off-highway vehicle or vehicle powertrain system), a work machine or work machine powertrain system, a genset or genset powertrain system, or a hydraulic fracturing rig or hydraulic fracturing rig powertrain system, to name several non-limiting examples. In shall be appreciated that system 100 may include a number of other components as will occur to one of skill in the art with the benefit and insight of the present disclosure.

In the illustrated example, system 110 is configured and provided as an internal combustion engine system including an intake air handling system 112, an engine 114, an exhaust system 116, a fueling system 158, and an electronic control system 130. It shall be appreciated that system 110 may include a number of other components as will occur to one of skill in the art with the benefit and insight of the present disclosure. In other example embodiments, system 110 may be configured and provided as another type of prime mover system such as, for example, a hybrid combustion engine-electric prime mover system, a battery electric prime mover system, a fuel cell prime mover system, or another type of prime mover system.

Intake air handling system 112 may include one or more air handling conduits, air filters, compressors (such as a compressor of a turbocharger or supercharger), coolers (such as charger air coolers, intercoolers, and/or aftercoolers which may be, for example, of an air-to-air type or an air-to-liquid type), and sensors (such as temperature sensors, pressure sensors, mass flow sensors, and other types of sensors), as well as other components.

Engine 114 may be provided in a number of forms and typically includes a block including a plurality of cylinders and a head coupled with the block. The head typically includes intake ports, intake valves configured to selectively open and close the intake ports, exhaust ports, exhaust valves configured to selectively open and close the exhaust ports, injector bores, fuel injectors disposed in the injector bores, spark plug bores, and spark plugs disposed in the spark plug bores. A plurality of pistons may be provided in respective ones of the plurality of cylinders. A crankshaft may be coupled with the plurality of pistons and configured to translate reciprocating motion of the plurality of pistons to provide torque for driving loads 109 which may include internal loads of system 110 (such oil pumps, valvetrains, fuel pumps and other loads of engine 114, and accessory loads of system 110). It shall be appreciated that system 110 may include a number of other components as will occur to one of skill in the art with the benefit and insight of the present disclosure.

Exhaust system 116 may include one or more exhaust handling conduits, turbines (such as a turbine of a turbocharger), aftertreatment components (such as oxidation catalysts, particular filters, selective catalytic reduction (SCR) catalysts, and/or other catalysts and aftertreatment components), and sensors (such as temperature sensors, pressure sensors, oxygen or lambda sensors, mass flow sensors, and other types of sensors), as well as other components.

Fueling system 158 may be configured and provided as a high-pressure common-rail fuel injection system including a plurality of fuel injectors in fluid communication with a common fuel rail, which supplies fuel at relatively high pressure to the plurality of fuel injectors. Fuel may be supplied to the common fuel rail by a high-pressure pump which, in turn, may be fed by a relatively low-pressure fuel circuit including a booster pump, which may be immersed in a tank containing a reservoir of fuel.

ECS 130 preferably includes one or more programmable microcontrollers of a solid-state, integrated circuit type, and one or more non-transitory memory media configured to store instructions executable by the one or more microcontrollers. For purposes of the present application the term microcontroller shall be understood to also encompass microprocessors and other types of integrated circuit processors. ECS 130 is in operative communication with and may be adapted and configured to control operation of and/or receive inputs from sensors or controllers of intake air handling system 112, engine 114, exhaust system 116, and fueling system 158. ECS 130 is in operative communication with and may be adapted and configured to control operation of and/or receive inputs from one or more system sensors 102 of system 100 which may include, for example, a throttle position sensor or an accelerator position sensor, or various other system sensors as will occur to one of skill in the art with the benefit and insight of the present disclosure. It shall be appreciated that FIG. 1 depicts control relationships between the foregoing components conceptually using dashed arrows and that various communications hardware and protocols may be utilized to implement, such as one or more controller area networks (CAN) or other communications components.

ECS 130 can be implemented in any of a number of ways that combine or distribute the control function across one or more control units in various manners. The ECS 130 may execute operating logic that defines various control, management, and/or regulation functions. This operating logic may be in the form of dedicated hardware, such as a hardwired state machine, analog calculating machine, programming instructions, and/or a different form as would occur to those skilled in the art. The ECS 130 may be provided as a single component or a collection of operatively coupled components; and may be comprised of digital circuitry, analog circuitry, or a hybrid combination of both of these types. When of a multi-component form, the ECS 130 may have one or more components remotely located relative to the others in a distributed arrangement. The ECS 130 can include multiple processing units arranged to operate independently, in a pipeline processing arrangement, in a parallel processing arrangement, or the like. It shall be further appreciated that the ECS 130 and/or any of its constituent components may include one or more signal conditioners, modulators, demodulators, Arithmetic Logic Units (ALUs), Central Processing Units (CPUs), limiters, oscillators, control clocks, amplifiers, signal conditioners, filters, format converters, communication ports, clamps, delay devices, memory devices, Analog to Digital (A/D) converters, Digital to Analog (D/A) converters, and/or different circuitry or components as would occur to those skilled in the art to perform the desired communications.

An operating environment 99 is also depicted in FIG. 1. As described above, during typical operation of system 100, ambient air 91 of operating environment 99 is received as an input to system 100, and treated exhaust 93 from system 100 is released to operating environment 99. In some embodiments, loads 109 may at least in part comprise a portion of operating environment 99. For example, in embodiments where system 100 is provided in the form of a genset or genset powertrain system, the one or more loads 109 may comprise loads at various nodes in a distributed power network in addition to load components which, even if small, are integral to system 100. As another example, in embodiments where system 100 is provided in the form of a vehicle or vehicle powertrain system, loads 109 may include forces such as wind, gravity, road surface friction and other environmental load components in addition to load components which, even if small, are integral to system 100.

Figure 2:
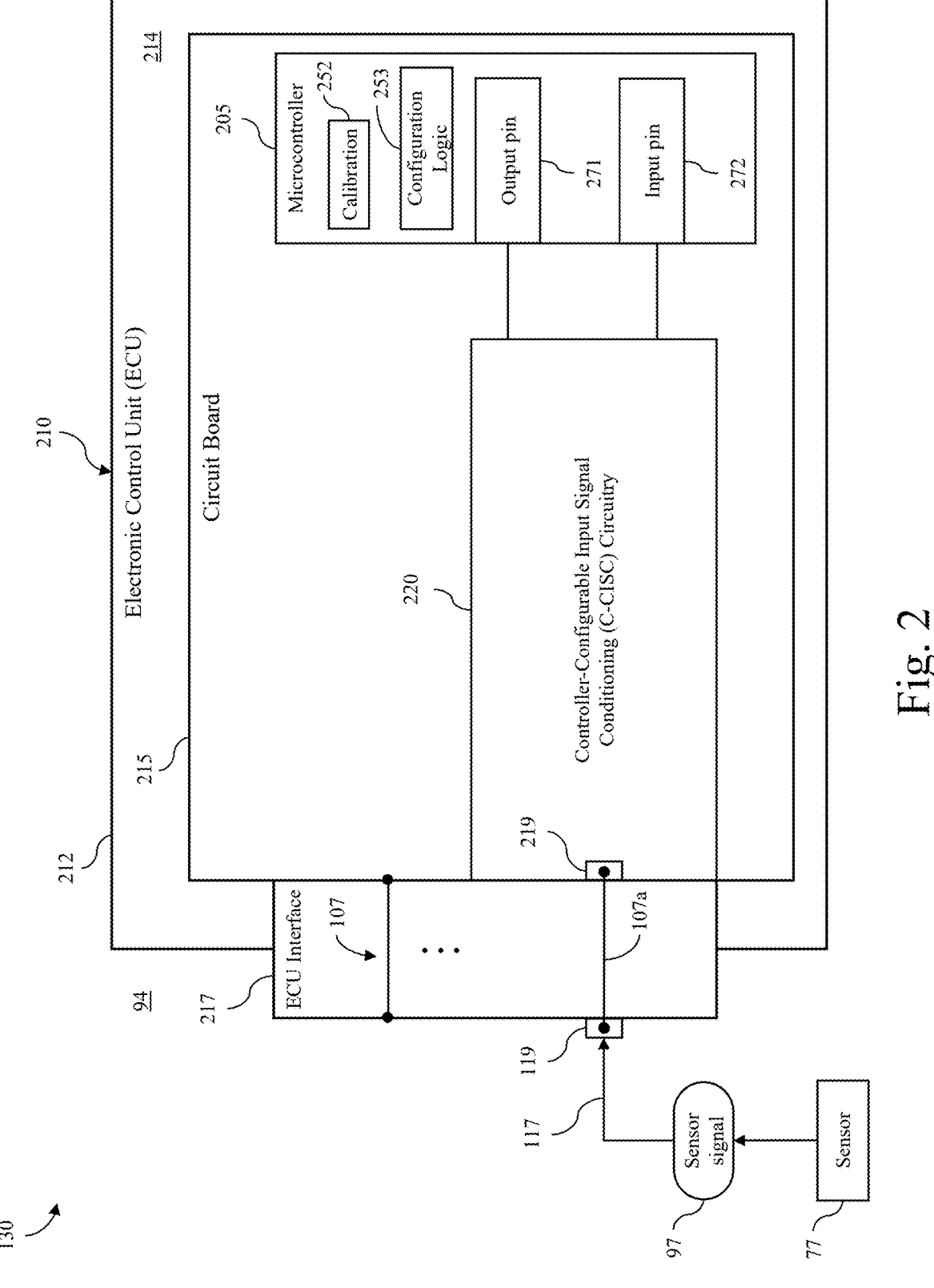
FIG. 2 is a schematic diagram depicting certain aspects of an example implementation of the system of FIG. 1

With reference to FIG. 2 there is illustrated an example implementation of certain aspects of ECS 130. In the illustrated example, ECS 130 comprises an electronic control unit (ECU) 210. While ECS 130 and ECU 210 are illustrated and described herein in connection with example powertrain systems, it shall be appreciated that other embodiments may include electronic control systems and electronic control units for a number of other power systems including, for example, fuel cell electronic control systems, battery management systems, hydrogen combustion engines, and fuel delivery systems, among other examples as will occur to one of skill in the art with the benefit and insight of the present disclosure.

The ECU 210 comprises a housing 212 and an interface 217. The housing 212 encloses an interior 214 containing a plurality of electronic control components. The interface 217 extends across the housing 212 and includes a plurality of interface pins 107 conductively accessible at the exterior 94 of the housing 212 and conductively accessible at the interior 214 of the housing 212.

A circuit board 215 is contained by the housing 212. The circuit board 215 comprises controller-configurable input signal conditioning ("C-CISC") circuitry 220 (also referred to herein as circuitry 220). Circuitry 220 includes an input terminal 219 which is operatively coupled with an interface pin 107a of interface 217 and operatively coupled with microcontroller 205. C-CISC circuitry 220 is also coupled with output pin 271 of microcontroller 205 and with input pin 272 of microcontroller 205. Microcontroller 205 is mounted on or otherwise operatively coupled with circuit board 215. Microcontroller 205 is configured to store with executable instructions including instructions in the form of configuration logic 253 and calibration data in the form of calibration 252. Configuration logic 253 is operable to read calibration 252 and provide one of a first output value and a second output value at output pin 271 in response reading calibration 252.

Interface pin 107a may be selectably operatively coupled with a sensor 77 by connector 119 of a harness 117 and the same are depicted in an operatively coupled state in FIG. 1, it being appreciated that harness 117 may also be decoupled from interface pin 107a. In such an operatively coupled state, interface pin 107a may receive a sensor signal 97 from sensor 77 which may, in turn, received and conditioned by C-CISC circuitry 220 and provided as input to microcontroller 205. The input signal 97 may be one of a plurality of forms depending on the selection and configuration of sensor 77. For example, sensor 77 may be configured provide sensor signal 97 in the form of an analog signal or a single edge nibble transmission (SENT) signal.

Figure 3:
FIG. 3 is a schematic diagram depicting certain aspects of example circuitry.

With reference to FIG. 3, there is illustrated an example implementation of circuitry 220. In the illustrated example, circuitry 220 includes an input node 319 which may be provided in the form of interface 217 or component thereof or may be provided in a number of other forms as will occur to one of skill in the art with the benefit and insight of the present disclosure.

An electrostatic discharge (ESD) diode 331 are coupled between input node 319 and ground. In the illustrated example, ESD diode 331 are provide in the form of parallel transient voltage suppressor (TVS) diodes configured to protect circuitry 220 against transients and overvoltage threats such as electrically fast transients and electrostatic discharge events. Resistor 311 and resistor 312 are also coupled with input node 319 and are further coupled with first configuration selection branch 381 and second configuration selection branch 382 respectively.

First configuration selection branch 381 includes switch 341 which is configured and provided in a solid-state form comprising a transistor (Q) which may comprise, for example, a MOSFET or another type of solid-state device as will occur to one of skill in the art with the benefit and insight of the present disclosure. Switch 341 includes a first terminal operatively coupled with a working voltage VDD, a second terminal which is coupled with resistor 311, and a third terminal which is coupled with SENT/Analog selection output pin 371 via a resistive network including resistor 315 and resistor 316.

Figure 4:
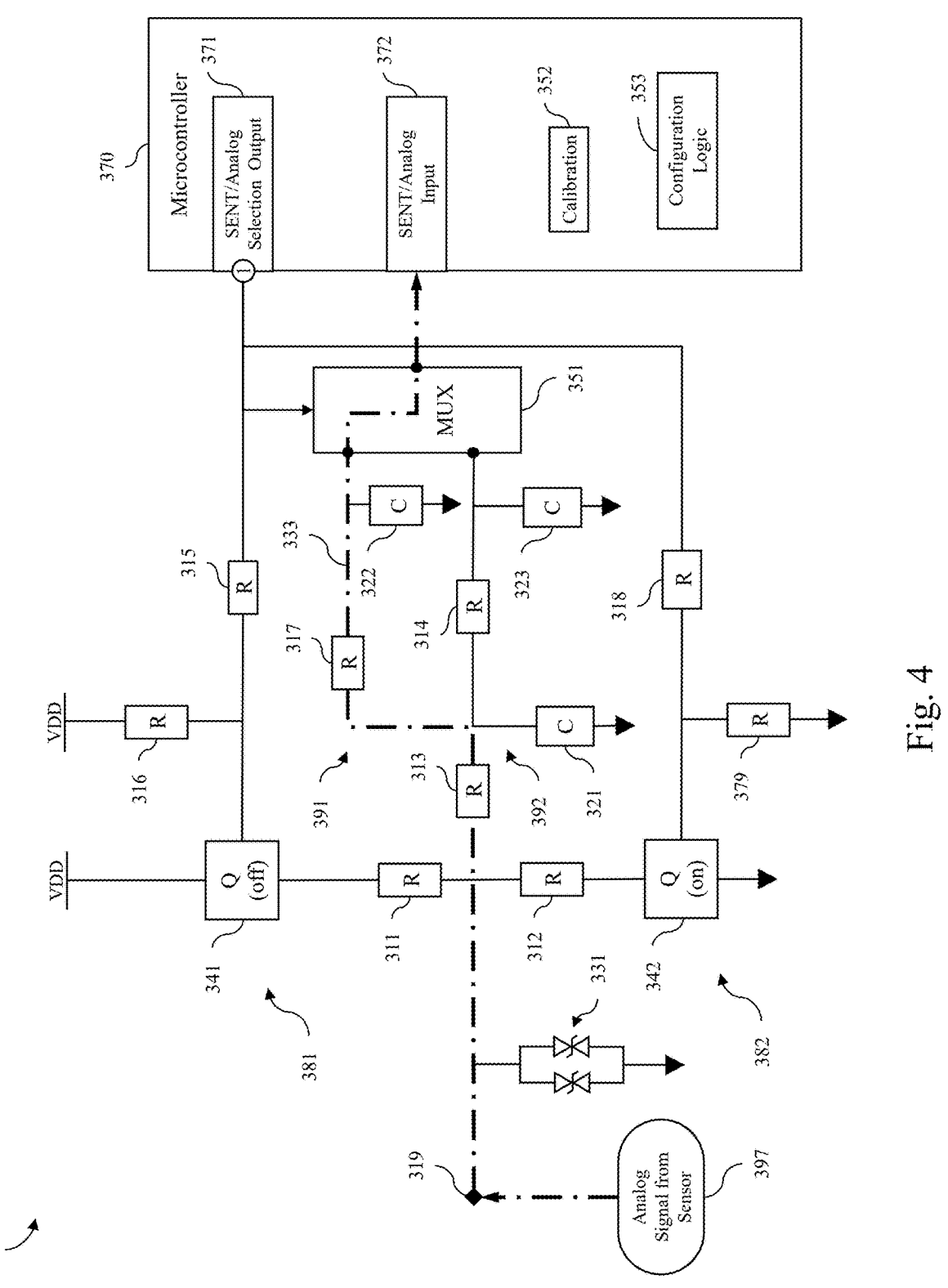
FIG. 4 is a schematic diagram depicting a first operational state of the example circuitry of FIG. 3.
Figure 5:
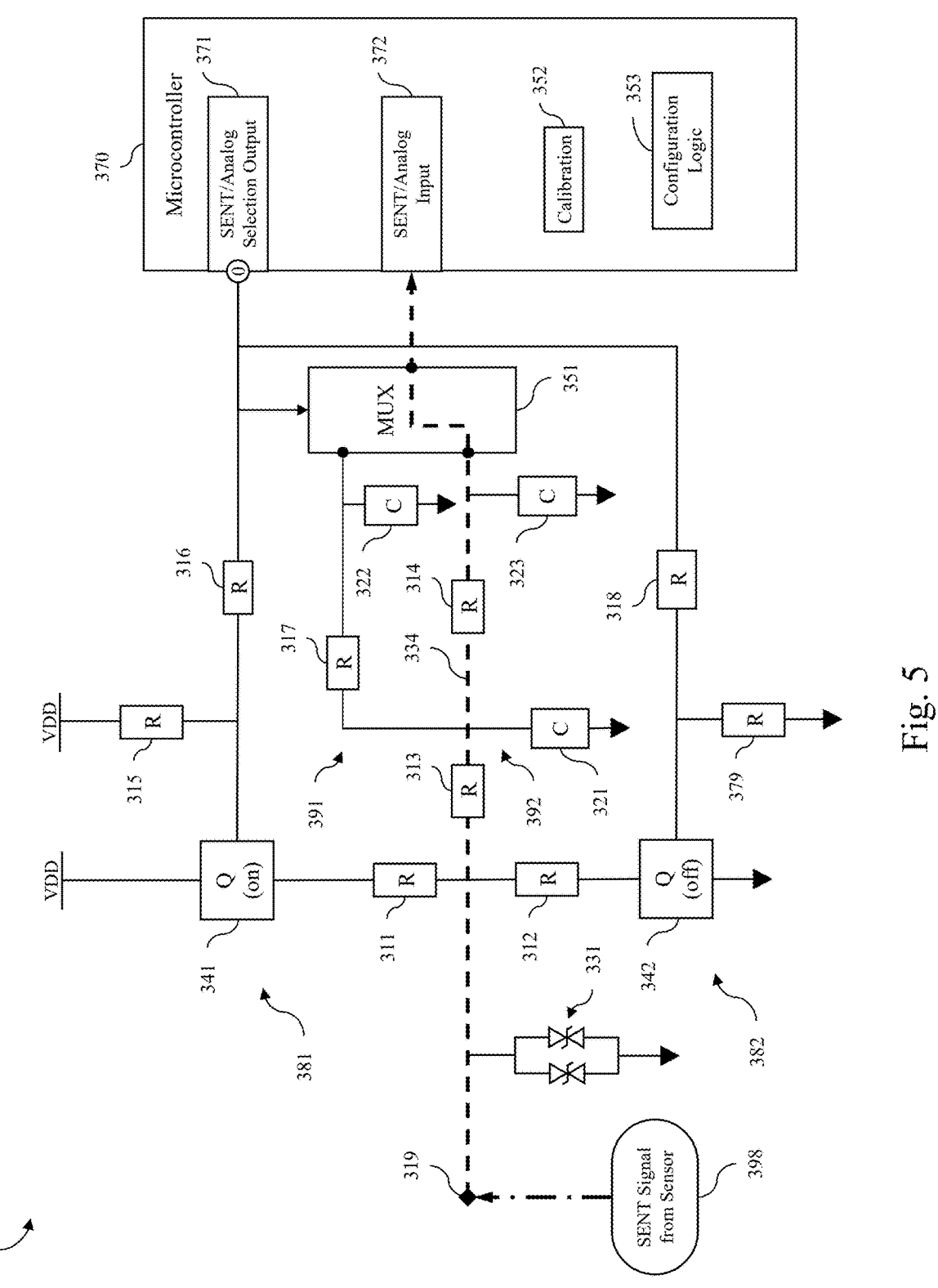
FIG. 5 is a schematic diagram depicting a second operational state of the example circuitry of FIG. 3.

Resistor 315 is coupled with working voltage VDD and the third terminal of switch 341. Resistor 316 is coupled with the third terminal of switch 341 and with SENT/Analog selection output pin 371 of microcontroller 370. Resistor 315 and resistor 316 are configured to provide a voltage at the third terminal of switch 341 effective to turn on switch 341 in response to a logical low (0) output of SENT/Analog selection output pin 371 (for example, as illustrated in FIG. 4) and effective to turn off switch 341 in response to a logical high (1) output of SENT/Analog selection output pin 371 (for example, as illustrated in FIG. 5).

Second configuration selection branch 382 includes switch 342 which is configured and provided in a solid-state form comprising a transistor (Q) which may comprise, for example, a MOSFET or another type of solid-state device as will occur to one of skill in the art with the benefit and insight of the present disclosure. Switch 342 includes a first terminal operatively coupled with resistor 312, a second terminal which is coupled with ground, and a third terminal which is coupled with SENT/Analog selection output pin 371 via a resistive network including resistor 318 and resistor 379.

Resistor 318 is coupled with the third terminal of switch 342 and with SENT/Analog selection output pin 371 of microcontroller 370. Resistor 379 is coupled with ground and the third terminal of switch 342. Resistor 318 and resistor 379 are configured to provide a voltage at the third terminal of switch 342 effective to turn on switch 342 in response to a logical high (1) output of SENT/Analog selection output pin 371 (for example, as illustrated in FIG. 4) and effective to turn off switch 341 in response to a logical high (1) output SENT/Analog selection output pin 371 (for example, as illustrated in FIG. 5).

Resistor 313 is coupled with input node 319 and with first signal conditioning branch 391 and second signal conditioning branch 392 of circuitry 220. First signal conditioning branch 391 includes resistor 317 which is coupled with resistor 313 and a first input of multiplexer (MUX) 351 and a capacitor 322. A first side of capacitor 322 is coupled with resistor 317 and first input of MUX 351 and a second side of capacitor 322 is coupled with ground. Second signal conditioning branch 392 includes resistor 314 which is coupled with resistor 313 and a second input of MUX 351, a capacitor 321, and a capacitor 322. A first side of capacitor 321 is coupled with resistor 313 and resistor 314 and a second side of capacitor 321 is coupled with ground. A first side of capacitor 323 is coupled with resistor 314 and second input of MUX 351 and a second side of capacitor 323 is coupled with ground. A selection input of MUX 351 is coupled with SENT/Analog selection output pin 371 of microcontroller 370. An output of MUX 351 is coupled with SENT/Analog input pin 372 of microcontroller 370.

Circuitry 220 is operatively coupled with SENT/Analog selection output pin 371 of microcontroller 370 and with SENT/Analog input pin 372 of microcontroller 370. Microcontroller 370 is configured to store with executable instructions including instructions in the form of configuration logic 353 and calibration data in the form of calibration 352. Configuration logic 353 is operable to read calibration 352 and provide one of a first output value and a second output value at SENT/Analog selection output pin 371 in response reading calibration 352.

As illustrated in FIG. 4, when switch 341 is turned off and switch 342 is turned on, a first voltage is present at input node 319 effective to configure circuitry 220 for conditioning an analog signal 397 provided to input node 319 to be provided to microcontroller 370 via first signal pathway 333 which extends from input node 319, through resistor 313, resistor 317, MUX 351 (via its first input) to SENT/Analog input pin 372 of microcontroller 370. Resistor 317 and capacitor 322 are one example of components which are configured as a first low pass filter with a first cutoff frequency configured for conditioning of analog signal 397. The first low pass filter may also be provided in other forms in other embodiments as will occur to one of skill in the art with the benefit and insight of the present disclosure.

As illustrated in FIG. 5, when switch 341 is turned on and switch 342 is turned off, a second voltage is present at input node 319 effective to configure circuitry 220 for conditioning a SENT signal 398 provided to input node 319 to be provided to microcontroller 370 via second signal pathway 334 which extends from input node 319, through resistor 313, resistor 314, MUX 351 (via its second input) to SENT/Analog input pin 372 of microcontroller 370. Resistor 314 and capacitor 323 are one example of components which are configured as a second low pass filter with a second cutoff frequency configured for conditioning of SENT signal 398. The second cutoff frequency may be different from the first cutoff frequency of the first low pass filter. The second low pass filter may also be provided in other forms in other embodiments as will occur to one of skill in the art with the benefit and insight of the present disclosure.

Figure 6:
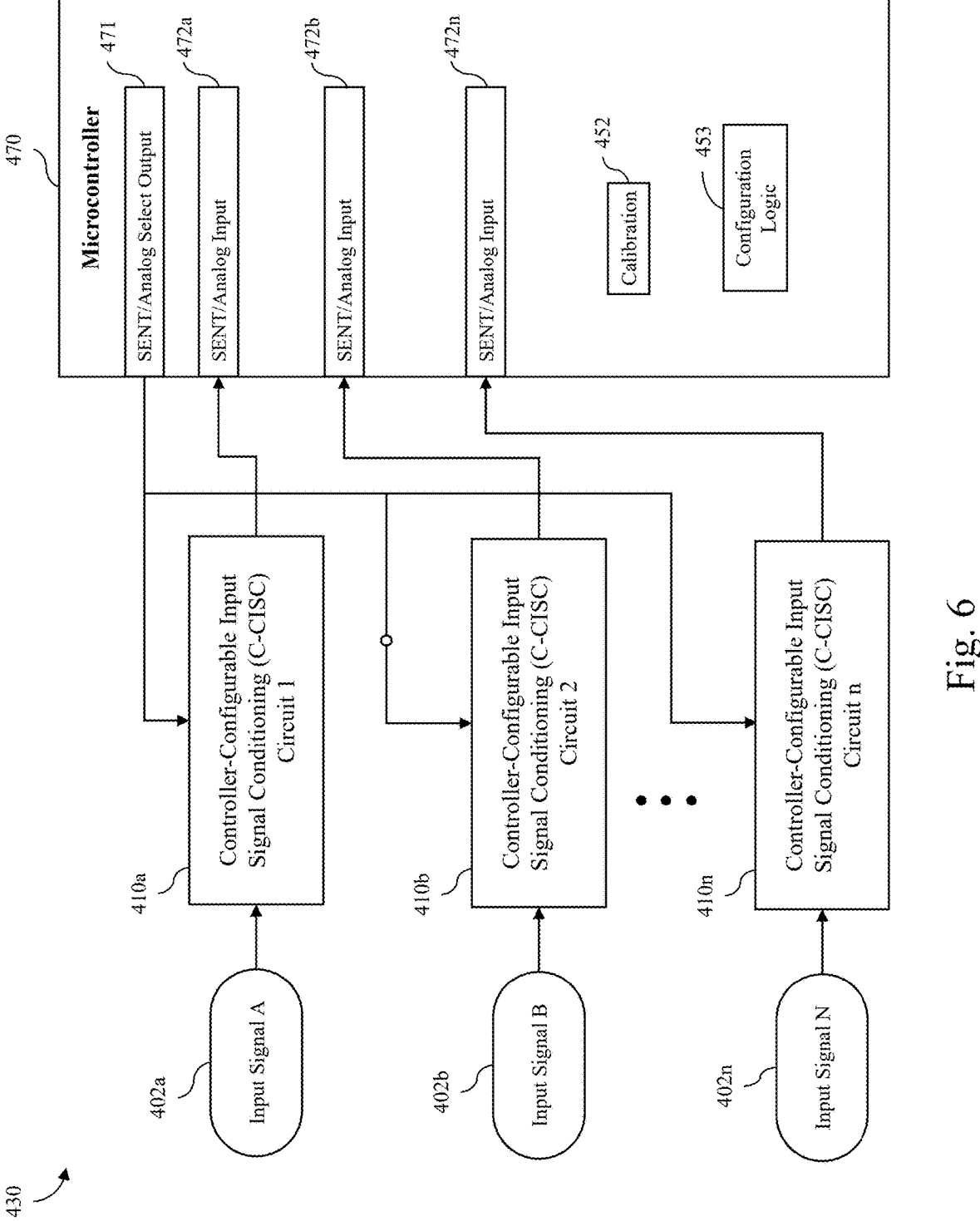
FIG. 6 is a schematic diagram depicting certain aspects of certain components of the example implementation of FIG. 2 in a first application.

With reference to FIG. 6, there are illustrated certain aspects of an example electronic control system (ECS) 430 including a microcontroller 470 operatively coupled with a plurality controller-configurable input signal conditioning ("C-CISC") circuitries 410a, 410b, . . . 410n which are configured to receive a respective plurality of input signals 402a, 402b, . . . 402n.

Microcontroller 470 may be configured and provide generally in a form similar to microcontroller 205, microcontroller 370, or another microcontroller according to the present disclosure. C-CISC circuitries 410a, 410b, . . . 410n may be configured and provided in the same or a substantially similar form as circuitry 220 described herein. In the illustrated example, microcontroller 470 is configured to store with executable instructions including instructions in the form of configuration logic 453 and calibration data in the form of calibration 452. Configuration logic 453 is operable to read calibration 452 and provide one of a first output value and a second output value at output pin 471 in response reading calibration 452.

C-CISC circuitry 410*a* is operatively coupled with SENT/ analog select output pin 471 and with SENT/analog input 472*a* of microcontroller 470. C-CISC circuitry 410*a* is configurable in response to an output value of SENT/analog select output pin 471 to selectably condition input analog signal A 402*a* as one of an analog input signal and a SENT input signal and provide the same to SENT/analog input 472*a*.

C-CISC circuitry 410*b* is operatively coupled with SENT/ analog select output pin 471 and with SENT/analog input 472*b* of microcontroller 470. C-CISC circuitry 410*b* is configurable in response to an output value of SENT/analog select output pin 471 to selectably condition input analog signal A 402*b* as one of an analog input signal and a SENT input signal and provide the same to SENT/analog input 472*b*.

C-CISC circuitry 410*n* is operatively coupled with SENT/ analog select output pin 471 and with SENT/analog input 472*n* of microcontroller 470. C-CISC circuitry 410*n* is configurable in response to an output value of SENT/analog select output pin 471 to selectably condition input analog signal B 402*n* as one of an analog input signal and a SENT input signal and provide the same to SENT/analog input 472*b*.

Figure 7:
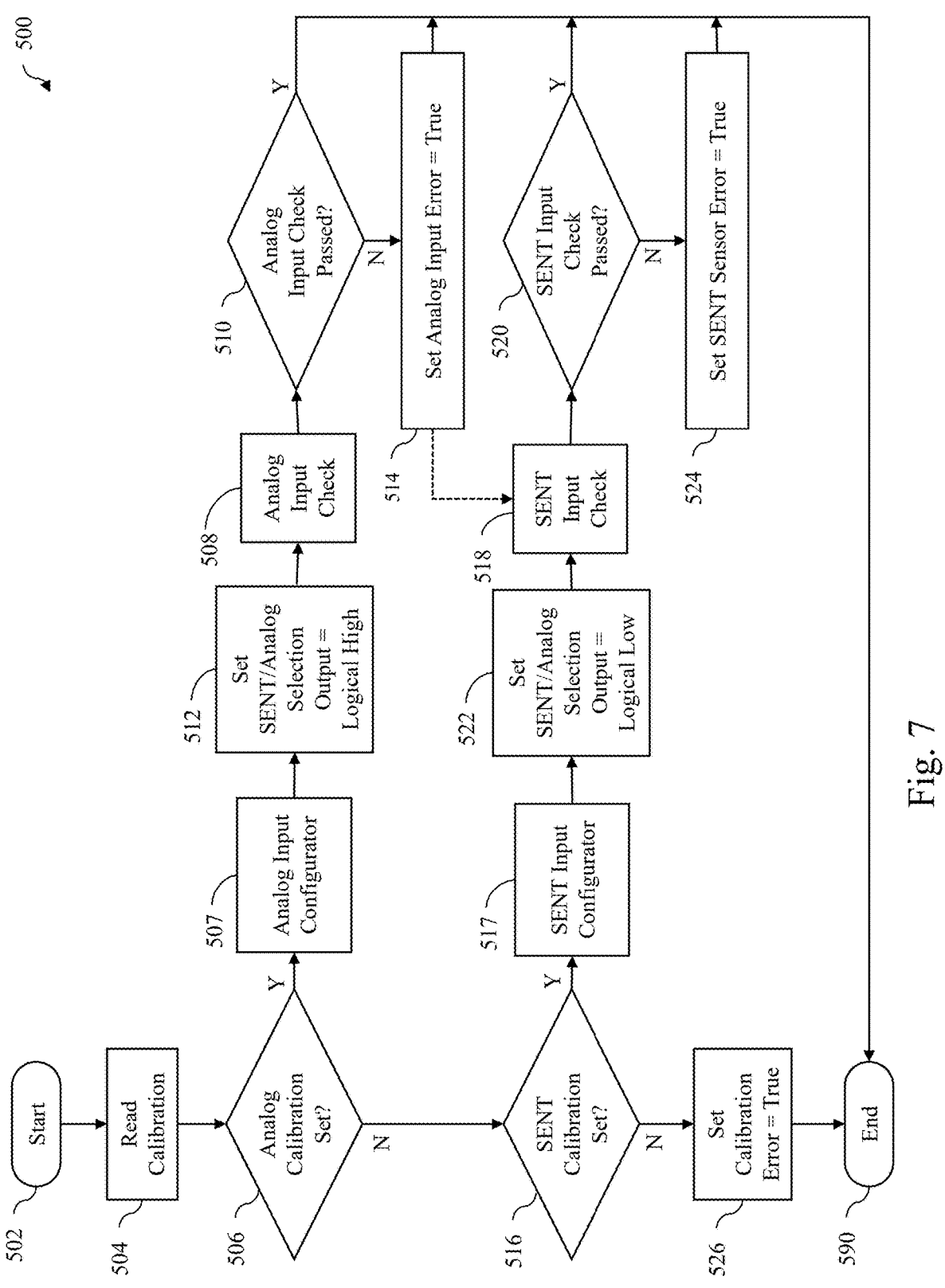
FIG. 7 is a flow diagram depicting certain aspects of an example process.

With reference to FIG. 7 there is illustrated an example system configuration process 500 (also referred to herein as process 500) which may be performed by or in connection with an electronic control system such as ECS 130 or another electronic control system, for example, by or in connection with microcontroller 205, microcontroller 370, or another microcontroller. Process 500 begins at start operation 502 and proceeds to operation 504 which reads one or more microcontroller calibrations, such as calibration 252, calibration 352 or another microcontroller calibration.

From operation 504, process 500 proceeds to conditional 506 which evaluates whether an analog calibration is set, for example, whether the calibration read at operation 504 is configured to cause the microcontroller to process and operate using an analog input. If conditional 506 evaluates affirmative, process 500 proceeds to operation 507 which configures the microcontroller to operate using an analog input.

From operation 507, process 500 proceeds to operation 512 which sets a SENT/analog selection output of the microcontroller to a logical high value. From operation 512, process 500 proceeds to operation 508.

At operation 508, the microcontroller performs an analog input check. Operation 508 may, for example, include the microcontroller otherwise controlling a system such as system 100 such that, in the case of a correctly functioning system, analog input is received, and the microcontroller is operated to detect and process such an input. From operation 508, process 500 proceeds to conditional 510.

Conditional 510 evaluates whether the analog input check was passed, for example, whether an analog input was received by the microcontroller and/or whether an expected value of an analog input was received by the microcontroller. If conditional 510 evaluates affirmative, process 500 proceeds to operation 514 which sets an Analog input error condition to a logical true value. From operation 514, process 500 proceeds to end operation 590 and may be subsequently repeated or recalled or, optionally, proceeds to operation 518.

If conditional 506 evaluates negative, process 500 proceeds to conditional 516 which evaluates whether a SENT calibration is set, for example, whether the calibration read at operation 504 is configured to cause the microcontroller to process and operate using a SENT input. If conditional 516 evaluates negative, process 500 proceeds to operation 526 which sets a calibration error condition equal to true. From operation 526 process 500 proceeds to end operation 590 and may be subsequently repeated or recalled.

If conditional 516 evaluates affirmative, process 500 proceeds to operation 517 which configures the microcontroller to operate using a SENT input. From operation 517, process 500 proceeds to operation 522 which sets a SENT/ analog selection output of the microcontroller to a logical low value. From operation 512, process 500 proceeds to operation 518.

At operation 518, the microcontroller performs a SENT input check. Operation 518 may, for example, include the microcontroller otherwise controlling a system such as system 100 such that, in the case of a correctly functioning system, SENT input is received, and the microcontroller is operated to detect and process such an input. From operation 518, process 500 proceeds to conditional 520.

Conditional 520 evaluates whether the SENT input check was passed, for example, whether a SENT input was received by the microcontroller and/or whether an expected value of a SENT input was received by the microcontroller. If conditional 520 evaluates affirmative, process 500 proceeds to proceeds to end operation 590 and may be subsequently repeated or recalled.

If conditional 520 evaluates negative, process 500 proceeds to operation 524 which sets a SENT input error to true. From operation 522, process 500 proceeds to end operation 590 and may be subsequently repeated or recalled.

If conditional 506 evaluates negative, process 500 proceeds to conditional 516 which evaluates whether a SENT calibration is set, for example, whether the calibration read at operation 504 is configured to cause the microcontroller to process and operate using a SENT input received. If conditional 516 evaluates negative, process 500 proceeds to operation 526 which sets a calibration error condition equal to true. From operation 526 process 500 proceeds to end operation 590 and may be subsequently repeated or recalled.

Figure 8:
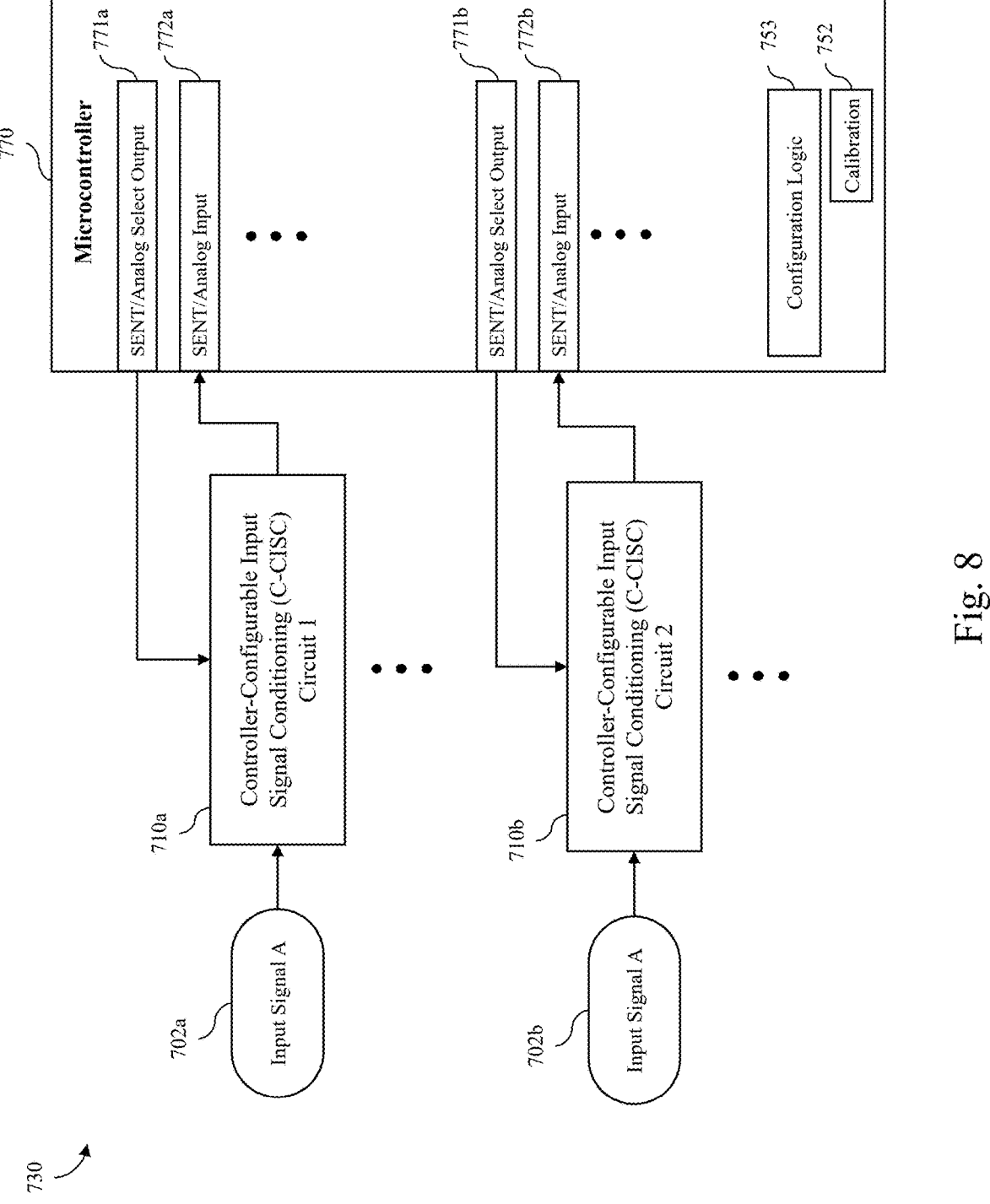
FIG. 8 is a schematic diagram depicting certain aspects of certain components of the example implementation of FIG. 2 in a second application.

With reference to FIG. 8, there are illustrated certain aspects of an example electronic control system (ECS) 730 including a microcontroller 770 operatively coupled with a plurality controller-configurable input signal conditioning ("C-CISC") circuitries 710*a*, 710*b* which are configured to receive a respective plurality of input signals 402*a*, 402*b*. It shall be appreciated that while two C-CISC circuitries and related inputs and output are depicted in the illustrated example, additional C-CISC circuitries and related inputs and output may be provided in various embodiments.

Microcontroller 770 may be configured and provide generally in a form similar to microcontroller 205, microcontroller 370, or another microcontroller according to the present disclosure. C-CISC circuitries 710*a*, 710*b* may be configured and provided in the same or a substantially similar form as circuitry 220 described herein. In the illustrated example, microcontroller 770 is configured to store with executable instructions including instructions in the form of configuration logic 753 and calibration data in the form of calibration 752. Configuration logic 753 is operable to read calibration 752 and provide one of a first output value and a second output value at output pin 771*a* in response reading calibration 752. Configuration logic 753 is operable to read calibration 752 and provide one of a first output value and a second output value at output pin 771*b* in response reading calibration 752.

C-CISC circuitry 710*a* is operatively coupled with SENT/analog select output pin 771*a* and with SENT/analog input 772*a* of microcontroller 770. C-CISC circuitry 710*a* is configurable in response to an output value of SENT/analog select output pin 771 a to selectably condition input analog signal A 702*a* as one of an analog input signal and a SENT input signal and provide the same to SENT/analog input 772*a*.

C-CISC circuitry 710*b* is operatively coupled with SENT/analog select output pin 771*b* and with SENT/analog input 772*b* of microcontroller 770. C-CISC circuitry 710*b* is configurable in response to an output value of SENT/analog select output pin 771*b* to selectably condition input analog signal A 702*b* as one of an analog input signal and a SENT input signal and provide the same to SENT/analog input 772*b*.

ECS 730 and microcontroller 770 provide an illustrative example of systems and circuitry according to the present disclosure wherein a microcontroller may include multiple SENT/analog select outputs which are configured to control operation of respective sets of C-CISC circuits, each set of C-CISC circuits comprising one or more C-CISC circuits.

As illustrated by this detailed description, the present disclosure contemplates multiple embodiments including the following example embodiments.

Example embodiment number 1 is a system comprising: a powertrain system including prime mover configured to drive one or more loads; a sensor configured to output a sensor signal indicative of an operational condition of the powertrain system; and an electronic control unit comprising a microcontroller and a controller-configurable input signal conditioning (C-CISC) circuit operatively coupling the microcontroller and the sensor, the microcontroller comprising an input pin, an output pin, a non-transitory controller-readable memory medium configured to store calibration data and instructions to selectably provide one of a first output and a second output at the output pin in response to the calibration data, the C-CISC circuit comprising an input node operatively coupled with the sensor, a first configuration selection branch including a first switch operatively coupled with the output pin, a second configuration selection branch including a second switch operatively coupled with the output pin, a multiplexer operatively coupled with the output pin, a first signal conditioning branch operatively coupled with the input node and operatively coupled with the input pin via a first input of the multiplexer, and a second signal conditioning branch operatively coupled with the input node and operatively coupled with the input pin via a second input of the multiplexer, the C-CISC circuit being selectably configurable in response to the first output at the sensor selection output pin to provide an analog signal input received at the input node to the input pin and configurable in response to the second output at the sensor selection output pin to provide a single edge nibble transmission (SENT) signal input received at the input node to the input pin.

Example embodiment number 2 includes the features of example embodiment number 1, wherein the first signal conditioning branch comprises a first signal path comprising a first resistor coupled with the input node, a second resistor coupled with the first resistor, and a third resistor coupled with the second resistor and coupled with the first input of the multiplexer.

Example embodiment number 3 includes the features of example embodiment number 2, comprising a capacitor operatively coupled with the first signal path intermediate the second resistor and the third resistor and operatively coupled with ground.

Example embodiment number 4 includes the features of example embodiment number 2, wherein the second signal conditioning branch comprises a second signal path comprising the first resistor, the second resistor, and a fourth resistor operatively coupled with the second resistor and with the second input of the multiplexer.

Example embodiment number 5 includes the features of example embodiment number 4, comprising a first capacitor operatively coupled with the second signal path intermediate the second resistor and the fourth resistor and operatively with ground, and a second capacitor operatively coupled with the second signal path intermediate the fourth resistor and the multiplexer and operatively coupled with ground.

Example embodiment number 6 includes the features of example embodiment number 1, wherein the C-CISC circuit comprises an electrostatic discharge protection component operatively coupled with the input node and operatively coupled with ground.

Example embodiment number 7 includes the features of example embodiment number 2, wherein the prime mover comprises an engine.

Example embodiment number 8 is an electronic control system comprising: an electronic control unit housing including a plurality of interface pins accessible at an exterior of the housing and at an interior of the housing; a circuit board disposed in the housing and operatively coupled with one or more of the plurality of interface pins, a microcontroller operatively coupled with the circuit board, the microcontroller comprising a sensor signal input pin, a sensor selection output pin, a non-transitory controller-readable memory medium configured to store a set of calibration data and instructions to selectably provide one of a first output and a second output at the sensor selection output pin in response to the calibration data; and a controller-configurable input signal conditioning (C-CISC) circuit operatively coupled with the circuit board and comprising an input node, a first configuration selection branch including a first switch operatively coupled with the sensor selection output pin, a second configuration selection branch including a second switch operatively coupled with the sensor selection output pin, a multiplexer operatively coupled with the sensor selection output pin, a first signal conditioning branch operatively coupled with the input node and operatively coupled with the sensor signal input pin via a first input of the multiplexer, and a second signal conditioning branch operatively coupled with the input node and operatively coupled with the sensor signal input pin via a second input of the multiplexer, the C-CISC circuit being configurable in response to the first output at the sensor selection output pin to provide an analog signal input received at the input node to the sensor signal input pin and configurable in response to the second output at the sensor selection output pin to provide a single edge nibble transmission (SENT) signal input received at the input node to the sensor signal input pin.

Example embodiment number 9 includes the features of example embodiment number 8, wherein the first signal conditioning branch comprises a first signal path comprising a first resistor coupled with the input node, a second resistor coupled with the first resistor, and a third resistor coupled with the second resistor and coupled with the first input of the multiplexer.

Example embodiment number 10 includes the features of example embodiment number 9, comprising a capacitor operatively coupled with the first signal path intermediate the second resistor and the third resistor and operatively coupled with ground.

Example embodiment number 11 includes the features of example embodiment number 9, wherein the second signal conditioning branch comprises a second signal path comprising the first resistor, the second resistor, and a fourth resistor operatively coupled with the second resistor and with the second input of the multiplexer.

Example embodiment number 12 includes the features of example embodiment number 11, comprising a first capacitor operatively coupled with the second signal path intermediate the second resistor and the fourth resistor and operatively with ground, and a second capacitor operatively coupled with the second signal path intermediate the fourth resistor and the multiplexer and operatively coupled with ground.

Example embodiment number 13 includes the features of example embodiment number 9, wherein the C-CISC circuit comprises an electrostatic discharge protection component operatively coupled with the input node and operatively coupled with ground.

Example embodiment number 14 includes the features of example embodiment number 9, wherein the input node is operatively coupled with a sensor configured to output a sensor signal indicative of an operational condition of a powertrain system.

Example embodiment number 15 is a process comprising: powering on an electronic control system comprising a microcontroller and a controller-configurable input signal conditioning (C-CISC) circuit operatively coupling the microcontroller and a sensor configured to output a sensor signal indicative of an operational condition of a powertrain system; providing at an output pin of the microcontroller one of a first output and a second output; and at least one of: (a) in response to the first output, configuring the C-CISC circuit to turn on a first switch, turn off a second switch, and select a first input of a multiplexer effective activate a first signal path between the sensor and an input pin of the microcontroller to condition an analog signal output by the sensor, and (b) in response to the second output, configuring the C-CISC circuit to turn off the first switch, turn on the second switch, and select a second input of the multiplexer effective activate a second signal path between the sensor and the input pin of the microcontroller to condition a single edge nibble transmission (SENT) signal output by the sensor.

Example embodiment number 16 includes the features of example embodiment number 15, wherein the first signal path comprises a first resistor coupled with an input node, a second resistor coupled with the first resistor, and a third resistor coupled with the second resistor and coupled with the first input of the multiplexer.

Example embodiment number 17 includes the features of example embodiment number 16, wherein a capacitor is operatively coupled with the first signal path intermediate the second resistor and the third resistor and operatively coupled with ground.

Example embodiment number 18 includes the features of example embodiment number 16, wherein the second signal path comprises the first resistor, the second resistor, and a fourth resistor operatively coupled with the second resistor and with the second input of the multiplexer.

Example embodiment number 19 includes the features of example embodiment number 18, wherein a first capacitor is operatively coupled with the second signal path intermediate the second resistor and the fourth resistor and operatively with ground, and a second capacitor operatively coupled with the second signal path intermediate the fourth resistor and the multiplexer and operatively coupled with ground.

Example embodiment number 20 includes the features of example embodiment number 15, comprising reading calibration data with the microcontroller, wherein the providing at the output pin of the microcontroller one of the first output and the second output is responsive to the reading calibration data.

It shall be appreciated that terms such as "a non-transitory memory," "a non-transitory memory medium," and "a non-transitory memory device" refer to a number of types of devices and storage mediums which may be configured to store information, such as data or instructions, readable or executable by a processor or other components of a computer system and that such terms include and encompass a single or unitary device or medium storing such information, multiple devices or media across or among which respective portions of such information are stored, and multiple devices or media across or among which multiple copies of such information are stored.

It shall be appreciated that terms such as "determine," "determined," "determining" and the like when utilized in connection with a control method or process, an electronic control system or controller, electronic controls, or components or operations of the foregoing refer inclusively to a number of acts, configurations, devices, operations, and techniques including, without limitation, calculation or computation of a parameter or value, obtaining a parameter or value from a lookup table or using a lookup operation, receiving parameters or values from a datalink or network communication, receiving an electronic signal (e.g., a voltage, SENT, current, or pulse-width modulation (PWM) signal) indicative of the parameter or value, receiving output of a sensor indicative of the parameter or value, receiving other outputs or inputs indicative of the parameter or value, reading the parameter or value from a memory location on a computer-readable medium, receiving the parameter or value as a run-time parameter, and/or by receiving a parameter or value by which the interpreted parameter can be calculated, and/or by referencing a default value that is interpreted to be the parameter value.

While example embodiments of the disclosure have been illustrated and described in detail in the drawings and foregoing description, the same is to be considered as illustrative and not restrictive in character, it being understood that only certain example embodiments have been shown and described and that all changes and modifications that come within the spirit of the claimed inventions are desired to be protected. It should be understood that while the use of words such as preferable, preferably, preferred or more preferred utilized in the description above indicates that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

The invention claimed is:

1. A system comprising:
a powertrain system including prime mover configured to drive one or more loads;
a sensor configured to output a sensor signal indicative of an operational condition of the powertrain system; and
an electronic control unit comprising a microcontroller and a controller-configurable input signal conditioning (C-CISC) circuit operatively coupling the microcontroller and the sensor, the microcontroller comprising an input pin, a sensor selection output pin, a non-transitory controller-readable memory medium configured to store calibration data and instructions to selectably provide one of a first output and a second output at the output pin in response to the calibration data, the C-CISC circuit comprising an input node operatively coupled with the sensor, a first configuration selection branch including a first switch operatively coupled with the output pin, a second configuration selection branch including a second switch operatively coupled with the output pin, a multiplexer operatively coupled with the output pin, a first signal conditioning branch operatively coupled with the input node and operatively coupled with the input pin via a first input of the multiplexer, and a second signal conditioning branch operatively coupled with the input node and operatively coupled with the input pin via a second input of the multiplexer, the C-CISC circuit being selectably configurable in response to the first output at the sensor selection output pin to provide an analog signal input received at the input node to the input pin and configurable in response to the second output at the sensor selection output pin to provide a single edge nibble transmission (SENT) signal input received at the input node to the input pin.

2. The system of claim 1, wherein the first signal conditioning branch comprises a first signal path comprising a first resistor coupled with the input node, a second resistor coupled with the first resistor, and a third resistor coupled with the second resistor and coupled with the first input of the multiplexer.

3. The system of claim 2, comprising a capacitor operatively coupled with the first signal path intermediate the second resistor and the third resistor and operatively coupled with ground.

4. The system of claim 2, wherein the second signal conditioning branch comprises a second signal path comprising the first resistor, the second resistor, and a fourth resistor operatively coupled with the second resistor and with the second input of the multiplexer.

5. The system of claim 4, comprising a first capacitor operatively coupled with the second signal path intermediate the second resistor and the fourth resistor and operatively with ground, and a second capacitor operatively coupled with the second signal path intermediate the fourth resistor and the multiplexer and operatively coupled with ground.

6. The system of claim 1, wherein the C-CISC circuit comprises an electrostatic discharge protection component operatively coupled with the input node and operatively coupled with ground.

7. The system of claim 2, wherein the prime mover comprises an engine.

8. An electronic control system comprising:
an electronic control unit housing including a plurality of interface pins accessible at an exterior of the housing and at an interior of the housing;
a circuit board disposed in the housing and operatively coupled with one or more of the plurality of interface pins,
a microcontroller operatively coupled with the circuit board, the microcontroller comprising a sensor signal input pin, a sensor selection output pin, a non-transitory controller-readable memory medium configured to store a set of calibration data and instructions to selectably provide one of a first output and a second output at the sensor selection output pin in response to the calibration data; and
a controller-configurable input signal conditioning (C-CISC) circuit operatively coupled with the circuit board and comprising an input node, a first configuration selection branch including a first switch operatively coupled with the sensor selection output pin, a second configuration selection branch including a second switch operatively coupled with the sensor selection output pin, a multiplexer operatively coupled with the sensor selection output pin, a first signal conditioning branch operatively coupled with the input node and operatively coupled with the sensor signal input pin via a first input of the multiplexer, and a second signal conditioning branch operatively coupled with the input node and operatively coupled with the sensor signal input pin via a second input of the multiplexer, the C-CISC circuit being configurable in response to the first output at the sensor selection output pin to provide an analog signal input received at the input node to the sensor signal input pin and configurable in response to the second output at the sensor selection output pin to provide a single edge nibble transmission (SENT) signal input received at the input node to the sensor signal input pin.

9. The electronic control system of claim 8, wherein the first signal conditioning branch comprises a first signal path comprising a first resistor coupled with the input node, a second resistor coupled with the first resistor, and a third resistor coupled with the second resistor and coupled with the first input of the multiplexer.

10. The electronic control system of claim 9, comprising a capacitor operatively coupled with the first signal path intermediate the second resistor and the third resistor and operatively coupled with ground.

11. The electronic control system of claim 9, wherein the second signal conditioning branch comprises a second signal path comprising the first resistor, the second resistor, and a fourth resistor operatively coupled with the second resistor and with the second input of the multiplexer.

12. The electronic control system of claim 11, comprising a first capacitor operatively coupled with the second signal path intermediate the second resistor and the fourth resistor and operatively with ground, and a second capacitor operatively coupled with the second signal path intermediate the fourth resistor and the multiplexer and operatively coupled with ground.

13. The electronic control system of claim 9, wherein the C-CISC circuit comprises an electrostatic discharge protection component operatively coupled with the input node and operatively coupled with ground.

14. The electronic control system of claim 9, wherein the input node is operatively coupled with a sensor configured to output a sensor signal indicative of an operational condition of a powertrain system.

15. A process comprising:

powering on an electronic control system comprising a microcontroller and a controller-configurable input signal conditioning (C-CISC) circuit operatively coupling the microcontroller and a sensor configured to output a sensor signal indicative of an operational condition of a powertrain system;

providing at an output pin of the microcontroller one of a first output and a second output; and at least one of: (a) in response to the first output, configuring the C-CISC circuit to turn on a first switch, turn off a second switch, and select a first input of a multiplexer effective activate a first signal path between the sensor and an input pin of the microcontroller to condition an analog signal output by the sensor, and (b) in response to the second output, configuring the C-CISC circuit to turn off the first switch, turn on the second switch, and select a second input of the multiplexer effective activate a second signal path between the sensor and the input pin of the microcontroller to condition a single edge nibble transmission (SENT) signal output by the sensor.

16. The process of claim 15, wherein the first signal path comprises a first resistor coupled with an input node, a second resistor coupled with the first resistor, and a third resistor coupled with the second resistor and coupled with the first input of the multiplexer.

17. The process of claim 16, wherein a capacitor is operatively coupled with the first signal path intermediate the second resistor and the third resistor and operatively coupled with ground.

18. The process of claim 16, wherein the second signal path comprises the first resistor, the second resistor, and a fourth resistor operatively coupled with the second resistor and with the second input of the multiplexer.

19. The process of claim 18, wherein a first capacitor is operatively coupled with the second signal path intermediate the second resistor and the fourth resistor and operatively with ground, and a second capacitor operatively coupled with the second signal path intermediate the fourth resistor and the multiplexer and operatively coupled with ground.

20. The process of claim 15, comprising reading calibration data with the microcontroller, wherein the providing at the output pin of the microcontroller one of the first output and the second output is responsive to the reading calibration data.

*   *   *   *   *